(12) United States Patent
Ishibashi et al.

(10) Patent No.: US 7,557,387 B2
(45) Date of Patent: Jul. 7, 2009

(54) AVALANCHE PHOTODIODE

(75) Inventors: Tadao Ishibashi, Tokyo (JP); Seigo Ando, Tokyo (JP); Yukihiro Hirota, Tokyo (JP)

(73) Assignees: Nippon Telegraph and Telephone Corporation, Tokyo (JP); NTT Electronics Corporation, Tokyo (JP)

( * ) Notice: Subject to any disclaimer, the term of this patent is extended or adjusted under 35 U.S.C. 154(b) by 340 days.

(21) Appl. No.: 10/587,818

(22) PCT Filed: Feb. 3, 2005

(86) PCT No.: PCT/JP2005/001599
§ 371 (c)(1),
(2), (4) Date: Mar. 12, 2007

(87) PCT Pub. No.: WO2005/076371
PCT Pub. Date: Aug. 18, 2005

(65) Prior Publication Data
US 2007/0200141 A1    Aug. 30, 2007

(30) Foreign Application Priority Data
Feb. 3, 2004    (JP) ............................. 2004-027302

(51) Int. Cl.
*H01L 31/107* (2006.01)
(52) U.S. Cl. .................... 257/186; 257/184; 257/187; 257/E31.063
(58) Field of Classification Search ................ 257/186, 257/184, 187, 257, 290, E31.063
See application file for complete search history.

(56) References Cited

U.S. PATENT DOCUMENTS
6,104,047 A    8/2000   Watanabe

FOREIGN PATENT DOCUMENTS
JP    61-198688    9/1986
JP    2000-022197  1/2000
JP    2004-031707  1/2004

OTHER PUBLICATIONS

Y. Muramoto et al., *InP/InGaAs Pin Photodiode Structure Maximising Bandwidth and Efficiency*, Electronics Letters, vol. 39, No. 24, Nov. 27, 2003, pp. 1749-1750.

*Primary Examiner*—Wai-Sing Louie
*Assistant Examiner*—Tifney L Skyles
(74) *Attorney, Agent, or Firm*—Workman Nydegger

(57) ABSTRACT

An ultra high speed APD capable of realizing reduction in an operating voltage and quantum efficiency enhancement at the same time is provided. Under operating conditions APD, a doping concentration distribution of each light absorbing layer is determined so that a p-type light absorbing layer (16) maintains a p-type neutrality except a part thereof, and a low concentration light absorbing layer (15) is depleted. Moreover, a ratio between a layer thickness $W_{AD}$ of the p-type light absorbing layer (16) and a layer thickness $W_{AD}$ of the low concentration light absorbing layer (15) is determined so that $W_{AD} > 0.3$ μm and a delay time of an element response accompanying a transit of carriers generated in the light absorbing layer by light absorption takes on a local minimum under a condition that a layer thickness $W_A$ ($=W_{AN}+W_{AD}$) of the light absorbing layer is constant.

3 Claims, 6 Drawing Sheets

AVALANCHE PHOTODIODE

TECHNICAL FIELD

The present invention relates to an ultra high speed avalanche photodiode.

BACKGROUND ART

An avalanche photodiode (APD) is a photodetector device, which multiplies carriers (electrons and holes) generated by light absorption through an avalanche mechanism and is used as an optical receiver with a low noise by taking out its output current. Recent APDs for a long wavelength band generally have a separated absorption and multiplication (SAM) structure, where a light absorbing layer and an avalanche multiplication layer are separated. In this SAM structure, in order to control electric field intensities of the light absorbing layer and the avalanche multiplication layer, an electric field control layer and a graded bandgap layer are provided between the two layers.

APDs are widely introduced to systems of 2.5 Gbit/s and 10 Gbit/s and are in a midst of development as elements for 40 Gbit/s system of the next generation.

In a technical field of such ultra high speed APD, APDs of "electron injection type", which are advantageous from the view points of high speed operation, are attracting attention rather than those of "hole injection type" adopting InP, which is a structure hitherto been typically used as a structure for relatively slow speed operation, as the avalanche multiplication layer. Typical APDs of electron injection type reported so far are those having depleted InGaAs as the light absorbing layer and the InAlAs as the avalanche multiplication layer, respectively.

FIG. 1 is a band diagram of the APD of such electron injection type under operating conditions. In this diagram, reference numerals 41, 42, 43, 44, 45, 46, and 47 denote an n-type electrode layer, an avalanche multiplication layer (InAlAs), an electric field control layer, a graded bandgap layer, a low-doped light absorbing layer (InGaAs), a p-type electrode layer, and a p electrode, respectively. Note that the light absorbing layer 45 is depleted throughout its entire region.

A structure of the APDs of such "electron injection type" is advantageous in the high speed operation. However, on the other hand, since a bandgap of InAlAs used as the avalanche multiplication layer is larger than that of InP, which has been used as the avalanche multiplication layer in a "hole injection type", the reduction in ionisation coefficient when a constant electric field intensity is applied, is inevitable and there is a problem that an operating voltage of the device is increased.

Apart from such a structure, a structure of the APD of "electron injection type" where the light absorbing layer is constituted of a p-type neutral layer (undepleted region) and a neighbouring thin low concentration layer (depleted region), and making the p-type neutral layer which is the undepleted region as the major light absorbing layer, is also reported (see Document 1).

FIG. 2 is a band diagram of such an APD of electron injection type under operating conditions. In this diagram, reference numerals 51, 52, 53, 54, 55, 56, 57, and 58 denote an n-type electrode layer, an avalanche multiplication layer, an electric field control layer, a bandgap inclined layer, a low concentration light absorbing layer (low concentration layer), a p-type light absorbing layer (p-type neutral layer), a p-type electrode layer, and a p electrode, respectively. Note that the p-type neutral layer, which is a non-depleted region, is an InGaAs layer.

A light absorbing layer of electron injection type APD of this structure is mostly occupied by a p-type light absorbing layer 56, which is the undepleted region. In other words, this structure is a "structure of making the light absorbing layer as p-type as much as possible." Although the major advantage of the APD with a structure shown in this figure is the dark current reduction, it is also an effective structure for reduction in an operating voltage.

Determination of the light absorbing layer thickness is important in order to obtain a desired performance of the APD. If a carrier generation rate (quantum efficiency) is not high during a state where the avalanche multiplication is absent (a pin photodiode operation), a high S/N ratio cannot be ensured even if the avalanche multiplication is carried out. Thus, this is the reason why designing a thickness ($W_A$) of light absorbing layer as thick as possible in a condition of a frequency response bandwidth needed to be ensured.

However, when an attempt is made to realize an operating speed of 10 Gbit/s or higher with the structure shown in FIG. 2 where the p-type neutral layer is the main light absorbing layer, a problem of reduction in a light absorption efficiency (quantum efficiency) arises due to a trade-off relationship between a carrier transit time and a quantum efficiency. This is caused by a fact that the carrier velocity in the p-type neutral InGaAs layer is usually smaller than that in the depleted InGaAs layer. In other words, this is because when the carrier transit time is designed so as to become equal to or lower than a certain value, an upper limit of a thickness of the p-type neutral InGaAs layer (p-type neutral layer) becomes thinner than that when using a depleted InGaAs layer.

Semiquantitative estimation for the frequency response bandwidth as a function of the light absorbing layer thickness will be described below.

The APD can be considered as a structure where a relatively thin avalanche multiplication layer is connected to a pin-type photodiode. Its bandwidth gradually decreases from an intrinsic bandwidth (intrinsic 3 dB bandwidth) in a state operating as the pin-photodiode and in then gradually approaches along a line of constant gain-bandwidth product as the avalanche multiplication factor increases. It is important to maintain the intrinsic 3 dB bandwidth high enough during the pin-photodiode operation together with the gain-bandwidth product high in order to obtain appropriately high gain. The intrinsic 3 dB bandwidth during the pin-photodiode operation is determined by the carrier transit time in the light absorbing layer and the multiplication layer. However, since the multiplication layer is far thinner than the light absorbing layer in a normal APD structure, the carrier transit time in the light absorbing layer is a dominant factor giving the intrinsic 3 dB bandwidth.

A multiplication layer structure can be designed almost independently from the light absorbing layer and it can be considered that the carrier transit time in the multiplication layer is commonly added. Thus, a bandwidth when taking only by the light absorbing layer into account is considered here. A saturation velocity ($v_h = 5 \times 10^6$ cm/s) of holes is far smaller than that of electrons. Therefore, when it is approximated that the carrier transit time $t_D$ in a structure (light absorbing layer thickness $W_{AD}$) where all the light absorbing layers are depleted, is determined by $v_h$, according to a charge control model, Formula (1) can be obtained.

$$t_D = W_{AD}/3v_h \tag{1}$$

Moreover, 3 dB bandwidth ($f_{3dB}$) is given by Formula (2).

$$f_{3dB,D} = 1/[2\pi t_D] = [1/W_{AD}(\mu m)] \times 24 \text{ GHz} \tag{2}$$

For example, when considering a margin in device design, $W_{AD}$ needs to be approximately 1.2 μm since $f_{3dB,D}$=20 GHz is a measure for the 3 dB bandwidth of APDs receiving 10 Gbit/s signals. In order to maintain the hole saturation velocity throughout the entire region of this $W_{AD}$, the electric field intensity needs to be 50 kV/cm or higher, in other words, a voltage needs to be at least 6 V or higher. Accordingly, since the electric field intensity of the light absorbing layer at the bias voltage for the avalanche multiplication is normally designed to be approximately 100 kV/cm, a voltage drop over the light absorbing layer part becomes 12 V, which is considerably large.

On the other hand, when the light absorbing part is only of a p-type neutral layer (with a constant concentration and a thickness of $W_{AN}$), the carrier transit time $\tau_N$ is determined by a diffusion time of electrons. Since holes generated in the p-type light absorbing layer are majority carriers, they respond in order to maintain charge neutrality not as hole motion but as a hole current. Hence, a hole transport does not participate directly in a response speed. Assuming a diffusion coefficient of electrons to be $D_e$, the carrier transit time ($t_N$) is derived by Formula (3).

$$t_N = W_{AN}^2 / 3D_e \quad (3)$$

The 3 dB bandwidth ($f_{3dB}$) is approximated by Formula (4).

$$f_{3dB,N} = 1/[2\pi t_N] \quad (4)$$

When InGaAs with a doping concentration of $3 \times 10^{17}$ cm$^3$ is used for the light absorbing layer, an electron mobility is 6,000 cm$^2$/V$_s$ and a diffusion coefficient is approximately 150 cm$^2$/s. Then the following formula is established.

$$f_{3dB,N} = [1/W_{AN}^2(\mu m^2)] \times 7.2 \text{ GHz} \quad (5)$$

In a similar way, when considering $f_{3dB,N}$=20 GHz as a measure, $W_{AN}$ needs to be approximately 0.6 μm or lower. When the p-type neutral light absorbing layer is used, it is advantageous for reducing an APD operating voltage since the voltage for a carrier transit is not required. On the other hand, since the light absorbing layer thickness is relatively thin being 0.6 μm, which is about a half of that of the depleted light absorbing layer, a quantum efficiency of 1.5 μm band remains 50% or less and it becomes difficult to realize an APD with a high sensitivity.

As described so far, when an attempt is made to realize a reduction in the operating voltage, which is desired in APDs by using p-type a neutral light absorbing layer, a problem of a reduction in a quantum efficiency of devices operating in a high speed of 10 Gbit/s or higher arises.

Document 1: Japanese Patent No. 3141847

DISCLOSURE OF THE INVENTION

The present invention is made in light of such problems and its object is to provide an ultra high speed APD, which is capable of realizing the reduction in an operating voltage and achieving a high quantum efficiency at the same time.

In the present invention, in order to achieve such an object, an invention according to a first aspect of the present invention is an APD comprising: a stacked layer bady in which an n-type electrode layer, an avalanche multiplication layer, an electric field control layer, a graded bandgap layer, a light absorbing layer with a layer thickness of $W_A$, and a p-type electrode layer are stacked sequentially, wherein the light absorbing layer has a junction of a p-type layer with a layer thickness of $W_{AN}$ located on the side of the p-type electrode layer and a low concentration layer with a layer thickness of $W_{AD}$ located on the side of the graded bandgap layer, an each doping profile of the p-type and the low concentration layers is determined under device operating conditions so that a p-type neutral state is maintained for the p-type layer except a region in a vicinity of an interface of the junction with the low concentration layer while the low concentration layer is depleted, and a ratio between the layer thickness $W_{AN}$ of the p-type layer and the layer thickness $W_{AD}$ of the low concentration layer is determined so as to satisfy a next formula in a case where $t_{total}$ is a delay time of element response accompanying a transit of carriers generated in the light absorbing layer by light absorption, $t_{N2}$ is a delay time caused by the p-type layer, $t_{D1}$ is a delay time caused by the low concentration layer, and $t_D$ is a delay time when an entire region of the light absorbing layer is the low concentration layer, under a condition that a layer thickness $W_A$ (=$W_{AN}$+$W_{AD}$) of the light absorbing layer is constant.

$$t_D > t_{total} = (W_{AD} \times t_{D1} + W_{AN} \times t_{N2})/W_A$$

In a second aspect of the present invention, according to the first aspect of the present invention, the ratio between the layer thickness $W_{AN}$ of the p-type layer and the layer thickness $W_{AD}$ of the low concentration layer is determined so that a formula $[(W_{AD} \times t_{D1} + W_{AN} \times t_{N2})/ W_A]$ takes on a local minimum.

A third aspect of the present invention, according to the first aspect of the present invention, the p-type layer and the low concentration layer are formed of an InGaAsP mixed crystal semiconductor, and a depletion thickness of the low concentration layer during the device operation is thicker than 0.3 μm ($W_{AD}$>0.3 μm).

According to the present invention, substantial reduction in the operating voltage is possible compared to the conventional APDs and it is possible to realize more reliable elements and a power reduction of a light receiver. Moreover, the device design is possible for a required bandwidth so as to achieve a maximum quantum efficiency (in other words, best receiver sensitivity).

As described so far, the present invention is the one to provide the ultra high speed APD capable of realizing reduction in the operating voltage and increase in the quantum efficiency in a bandwidth used at the same time, and to contribute in a stable operation and enhanced performance of an ultra high speed optical receiver including a 10 Gbit/s region for example.

BEST MODE FOR CARRYING OUT THE INVENTION

Figure 1:
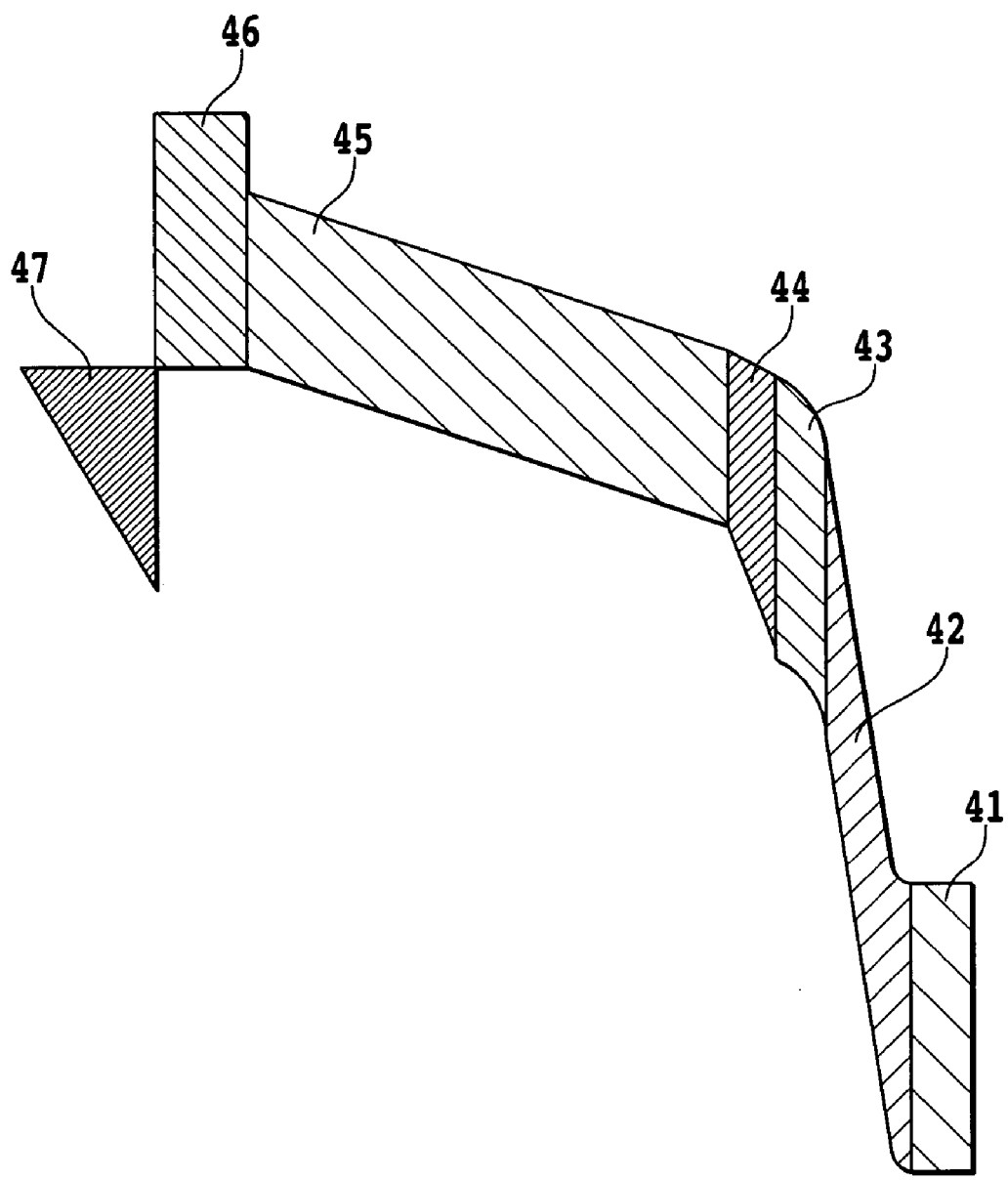
FIG. 1 is a band diagram of a conventional typical avalanche photodiode (APD) of electron injection type under operating conditions.

Embodiments of the present invention will be described below by referring to the drawings.

First Embodiment

Figure 3A:
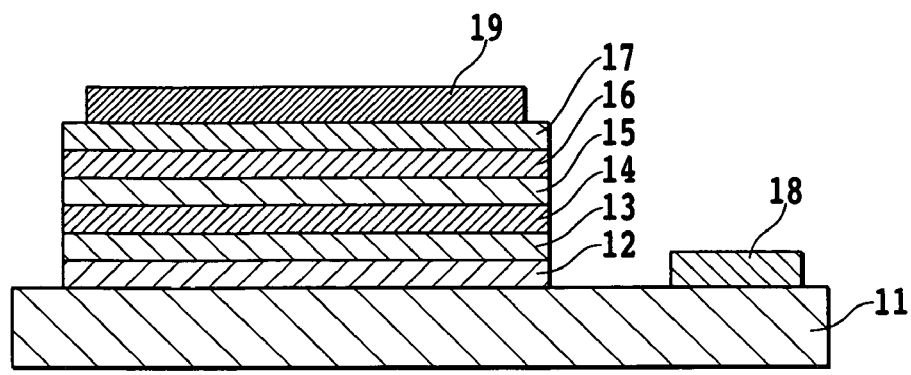
FIG. 3A is a schematic diagram of a cross sectional structure of an APD of the present invention.
Figure 3B:
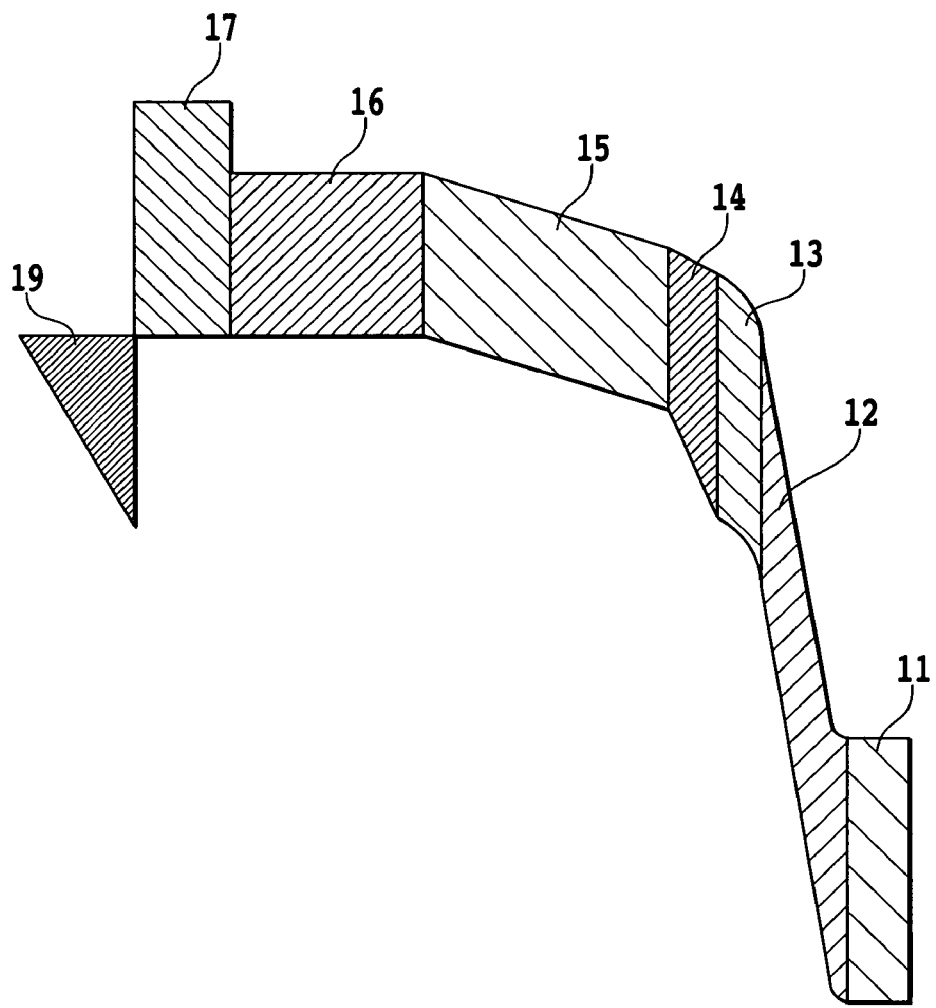
FIG. 3B is a band diagram of the APD of the present invention under operating conditions.

FIGS. 3A and 3B are diagrams for explaining a configuration example of an APD of the present invention, and FIG. 3A is a cross sectional view and FIG. 3B is a band diagram during operation. In these figures, reference numerals 11, 12, 13, 14, 15, 16, 17, 18, and 19 denote an n-type electrode layer of n-type InP, an InP avalanche multiplication layer, an InP electric field control layer, an InGaAsP graded bandgap layer, a low concentration light absorbing layer of InGaAs of low concentration, a p-type light absorbing layer of p-type InGaAs, a p-type electrode layer of p-type InGaAsP, and metal electrodes (n electrode and p electrode), respectively. Note that the p-type light absorbing layer 16 and the low concentration light absorbing layer 15 can be formed as InGaAsP mixed crystal semiconductors and are not limited to InGaAs.

In this APD, doping concentration distribution of each of the light absorbing layers is determined so that a neutrality of p-type light absorbing layer 16 (undepleted) is maintained except a part on the side of low concentration light absorbing layer 15 and also the low concentration light absorbing layer 15 (depleted light absorbing layer) is depleted.

When light signals are given to the light absorbing layers, electron/hole pairs are generated in the p-type light absorbing layer 16 and the low concentration light absorbing layer 15. Electron flow from the p-type light absorbing layer 16 into the electrode 19 is blocked by a potential barrier formed in the p-type electrode layer 17 and diffuse into the depleted low concentration light absorbing layer 15. At the same time, electrons and holes in the depleted low concentration light absorbing layer 15 respectively drift in the opposite directions by an electric field to flow to both sides of the low concentration light absorbing layer 15. Electrons generated in these two light absorbing layer reach the avalanche multiplication layer 12 via the graded bandgap layer 14 of InGaAsP and the electric field control layer 13 of InP, and cause an impact ionisation (avalanche multiplication).

Only a depleted part of the low concentration light absorbing layer 15 generates a voltage drop in the light absorbing layer. Accordingly, when using a similar avalanche multiplication layer, a voltage required for an operation is lowered compared to that of the conventional APDs where all the light absorbing layers are depleted. For example, in order to ensure a sufficient quantum efficiency, the voltage drop in the light absorbing layer is approximately 12 V in a conventional typical structure where the light absorbing layer is depleted throughout its entire region and a light absorbing layer thickness is 1.2 μm. On the other hand, according to the APD of the present invention, when a layer thickness of the depleted low concentration light absorbing layer 15 is $W_{AD}$=0.7 μm and a layer thickness of the p-type light absorbing layer 16 is $W_{AN}$=0.5 μm, by assuming an electric field of the light absorbing layer 100 kV/cm during operation of avalanche multiplication, the voltage drop is 7 V and the required operating voltage of the APD is reduced by 5V.

Figure 2:
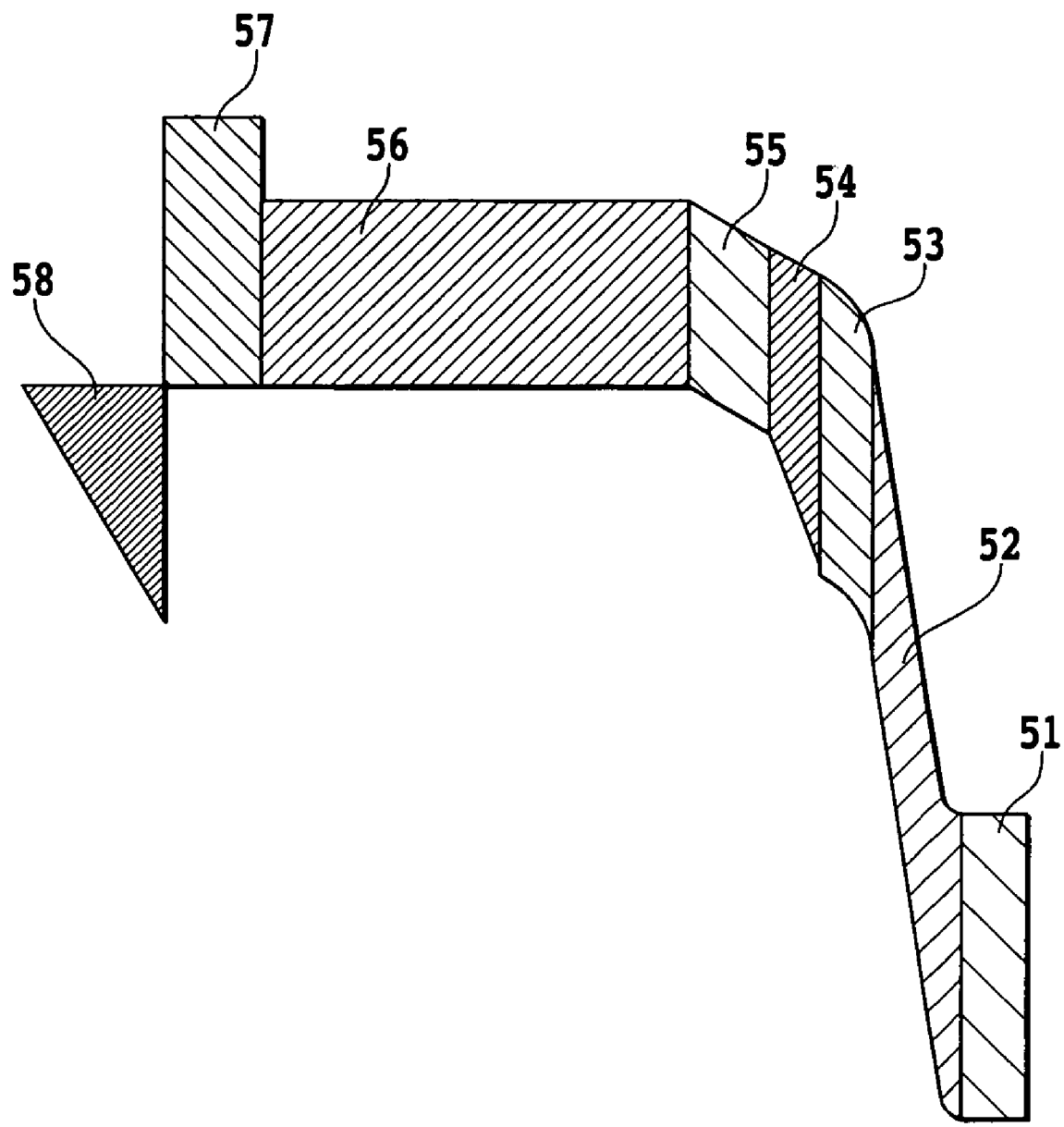
FIG. 2 is a band diagram of an avalanche APD of electron injection type disclosed in Document 1 under operating conditions.

On the other hand, although a "structure of making the light absorbing layer as p-type as much as possible" shown in FIG. 2 is suited for the reduction in an operating voltage, it cannot avoid a constraint of reduction in efficiency when ensuring an operating bandwidth above a certain level (for example 10 Gbit/s operation) as described above.

Figure 4:
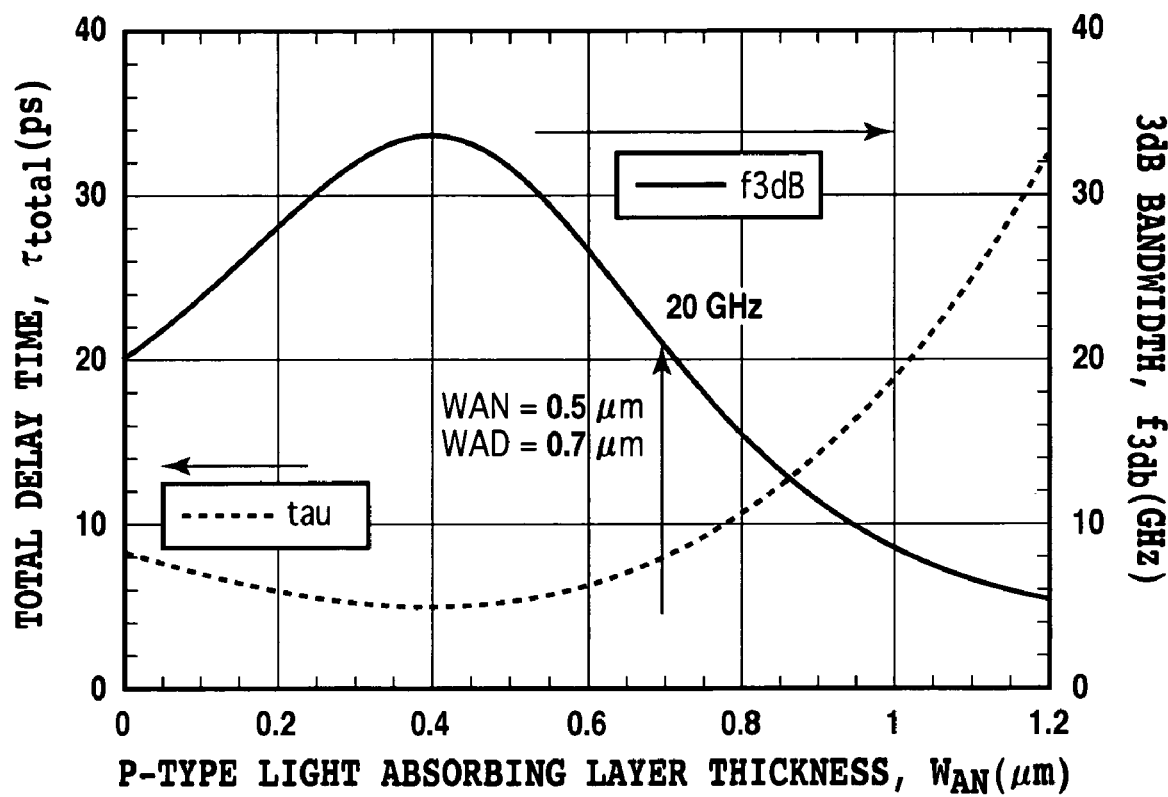
FIG. 4 is a diagram for explaining a sample calculation of a delay time ($t_{total}$) of element response accompanying a carrier transit and dependency of a 3 dB bandwidth on a thickness $W_{AN}$ of a p-type neutral light absorbing layer.

FIG. 4 is a diagram for explaining a sample calculation of a delay time ($t_{total}$) of element response accompanying the carrier transit and dependency of the 3 dB bandwidth on the thickness $W_{AN}$ of the p-type light absorbing layer of the APD of the present invention in a case where a total thickness of the light absorbing layer is 1.2 μm. From this diagram, it can be interpreted that a similar level of performance to that of the conventional APD can be realized in terms of the operation bandwidth, with the assumption that $W_{AD}$=0.7 μm and $W_{AN}$=0.5 μm.

After all, according to the present invention, the operating voltage can be reduced by 5 V while maintaining the same quantum efficiency and an operating speed as those of the conventional APDs. In terms of an operating speed, note that as will be described in detail in the next "second embodiment", a "structure combining the depleted light absorbing layer and the p-type light absorbing layer under a condition of a constant light absorbing layer thickness" always give a parameter range where realization of a higher bandwidth compared to that of the conventional APDs is possible.

Differences between the APD described in Document 1 and that of the present invention here is described as follows. That is, the aim of the APD in Document 1 is to improve "deterioration of a dark current with time" while that of the present invention is "realization of compatibility between voltage reduction and quantum efficiency enhancement."

In the APD in Document 1, for achieving such purpose, the layer thickness of the depleted light absorbing layer is made thin enough to enhance the effect of surface area minimization. The effect results in suppressing deterioration of the dark current with time. Therefore, the APD described in Document 1 is able to realize stable dark current characteristics/high reliability. On the other hand, the present invention is enabling "realization of compatibility between voltage reduction and quantum efficiency enhancement" by "determining the thicknesses of depleted and undepleted regions so that the total carrier transit time takes on a local minimum."

As a result of such differences in the configuration, thicknesses of the depleted and undepleted regions are set independently in the APD described in Document 1. On the other hand, thicknesses of the depleted and undepleted regions are determined (optimized) so that the total carrier transit time takes on the local minimum under a condition that the total thickness of the light absorbing layer constituted by these regions is constant in the present invention.

Note that when comparing a level of the dark current of the APD with the structure shown in FIG. 2, since the depleted light absorbing layer of the APD of the present invention is thicker, this thickness of the depleted light absorbing layer can become a cause of increase in the dark current. However, such dark current can be avoided as an APD provided with a guard ring structure in order to lower an electric field intensity on a device surface.

Second Embodiment

When the carrier transit time, which is independent in each layer (in the depleted light absorbing layer and the p-type light absorbing layer), in the bandwidth during the pin-PD operation of the APD of the present invention is determined, basically following Formulae (1) and (3). First, $t_N=W_{AN}^2/3D_e$ is obtained as the carrier transit time in the p-type light absorbing layer. Moreover, since a layer thickness of an avalanche layer is thin, when ignoring influences of the part, $t_D=W_{AD}/3v_h$ is obtained as the carrier transit time in the depleted light absorbing layer.

In accordance with a definition in a charge control model, a relationship between charge variation ($\Delta Q_D$ and $\Delta Q_N$ in the depleted and the p-type light absorbing layers, respectively) and current variation ($\Delta I_D$ and $\Delta I_N$ in the depleted and the p-type light absorbing layers, respectively) in respective layers is described by the following formula.

$$t_D=\Delta Q_D/\Delta I_D, \; t_N=\Delta Q_N/\Delta I_N \quad (6)$$

By setting the total thickness of the light absorbing layer $W_A=W_{AD}+W_{AN}$, when carriers are generated at the same time in each layer, generally, the total carrier transit time $t_{total}$ is not a simple sum ($t_D+t_N$). This is because in a general structure, since carriers generated in a depleted layer "D1" and a neutral layer "N2" affect charge density in each other's region, terms of charge increment ($\Delta Q_{N1}$ and $\Delta Q_{D2}$) in each other's region are added. After all, the relationship between the charge variation ($\Delta Q_{D1}+\Delta Q_{N1}$ and $\Delta Q_{N2}+\Delta Q_{D2}$) and the current variation ($\Delta I_D$ and $\Delta I_N$) due to carrier generation in the depleted layer "D1" and the neutral layer "N2" is given by the following formula.

$$t_{D1}=(\Delta Q_{D1}+\Delta Q_{N1})/\Delta I_D, \; t_{N2}=(\Delta Q_{N2}+\Delta Q_{D2})/\Delta I_N \quad (7)$$

Note here the relationships $t_{D1} \geqq t_D$ and $t_{N2} \geqq t_N$.

However, in an electron ejection structure using an InP semiconductor with extremely different velocities of electrons and holes, the total carrier transit time is approximated by the following formula when the transit time of layers other than the light absorbing layers is ignored.

$$t_{total1}=(W_{AD} \times t_{D1}+W_{AN} \times t_{N2})/W \quad (8)$$

The formula described above is in a form of sum of $t_{D1}$ and $t_{N1}$ proportionally weighted by the layer thickness.

The reason why it can be simplified as Formula (8) is as follows. When the electron velocity is sufficiently larger than the hole velocity, electron charge injected from the p-type light absorbing layer to the depleted light absorbing layer changes a charge state (determined mostly by holes) only slightly in the depleted layer. On the other hand, when the holes generated in the depleted light absorbing layer flow into the p-type light absorbing layer, charges are not induced since the p-type light absorbing layer is neutral. Accordingly, a condition of $\Delta Q_{N1}=\Delta Q_{D2}=0$ is established and a total charge variation is approximated as $\Delta Q_{D1}+\Delta Q_{N2}$. A transit time for the total charge is described by the following formula by taking a sum ($=\Delta I_D+\Delta I_N$) of amount of current variation.

$$t_{total}=(\Delta Q_{D1}+\Delta Q_{N2})/(\Delta I_D+\Delta I_N) \quad (9)$$

Furthermore, since $\Delta I_D$ and $\Delta I_N$ are proportional to the corresponding layer thicknesses $W_{AD}$ and $W_{AN}$, the following formula is derived from Formulae (8) and (9).

$$\begin{aligned} t_{total} &\approx (\Delta I_D \times t_{D1}+\Delta I_N \times t_{N2})/(\Delta I_D+\Delta I_N) \\ &\approx (W_{AD1} \times t_D+W_{AN} \times t_N)/(W_{AD}+W_{AN}) \\ &= (W_{AD}^2/3v_h+W_{AN}^3/3D_e)/W_A \\ &= [(W-W_{AN})^2/3v_h+W_{AN}^3/3D_e]/W_A \end{aligned} \quad (10)$$

Since the bandwidth is approximated by $f_{3dB}=1/[2\pi t_{total}]$, by setting $W_{AD}$ and $W_{AN}$ so that $t_{total}$ in Formula (10) becomes minimum, the bandwidth of the APD of the present invention can be maximized.

When $W_A$ is constant, Formula (10) takes on the local minimum at:

$$W_{AN}=[-2D_e/3v_h+[(2D_e/3v_h)^2+8WD_e/3v_h]n^{0.5}]/2. \quad (11)$$

When being deviated from this, $t_{total}$ increases and $f_{3dB}$ decreases.

An important point here is that the bandwidth increases by adopting the combined structure of the depleted and p-type light absorbing layers under a condition that the total thickness of the light absorbing layer $W_A=W_{AD}+W_{AN}$ is constant. Moreover, since a local minimum point of $t_{total}$ is clearly a monotonically increasing function of W, it is understood that a combination of $W_{AD}$ and $W_{AN}$ giving the local minimum point of $t_{total}$ gives a maximum value of $W_A$, i.e. a maximum point of the quantum efficiency for a constant $t_{total}$ or $f_{3dB}$.

Third Embodiment

The combination of $W_{AD1}$ and $W_{AN}$ where the bandwidth $f_{3dB}$ becomes maximum in a specific structure of the APD of the present invention will be described below. Here, an APD of 40 Gbis/s is considered as a structure example.

Figure 5A:
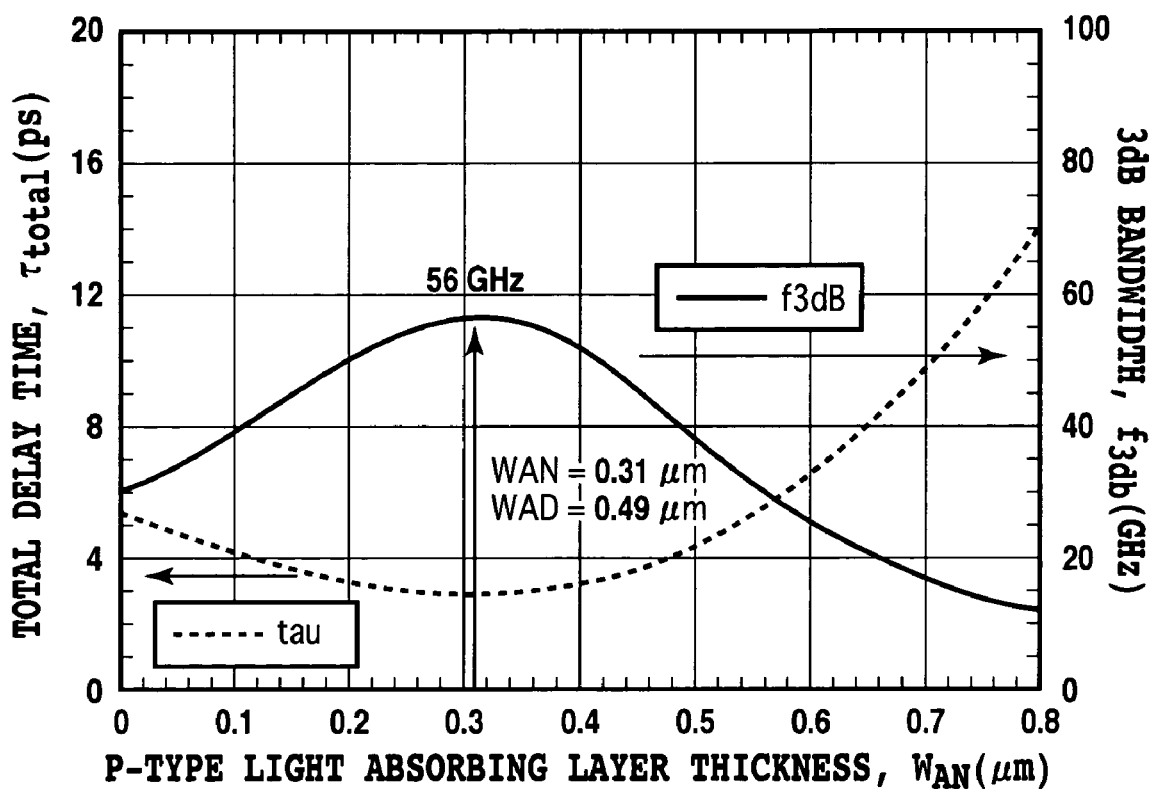
FIG. 5A is a diagram for explaining variation in a carrier transit time and the 3 dB bandwidth during a pin-PD operation of the APD of the present invention, and for explaining a sample calculation of $t_{total}$ and $f_{3dB}$ when $W_A$=$W_{AD}$+$W_{AN}$=0.8 μm, $D_e$=150 cm$^2$/s, and $v_h$=5×10$^6$ cm/s.

FIG. 5A is a diagram for explaining sample calculations of $t_{total}$ and $f_{3dB}$ by setting $W_A=W_{AD}+W_{AN}=0.8$ μm, $D_e=150$ cm$^2$/s, $v_h=5 \times 10^6$ cm/s. When the thickness of the p-type light absorbing layer is $W_{AN}=0.31$ μm and the thickness of the depleted light absorbing layer is $W_{AD}=0.49$ μm, $t_{total}$ takes on a minimum value of 2.8 ps and $f_{3dB}$ takes on a maximum value of 55 GHz. In other words, when compared to $f_{3dB}$ (11 GHz) in a structure configured only by the p-type light absorbing layer or $f_{3dB}$ (30 GHz) in a structure configured only by the depleted light absorbing layer, a dramatic increase in bandwidth can be expected.

An operation of the APD is restricted by a gain-bandwidth product and its limit is considered to be approximately 200 GHz. A bandwidth capable of obtaining a meaningful avalanche multiplication gain M (for example M=2.5) is approximately 80 GHz at a maximum.

Figure 5B:
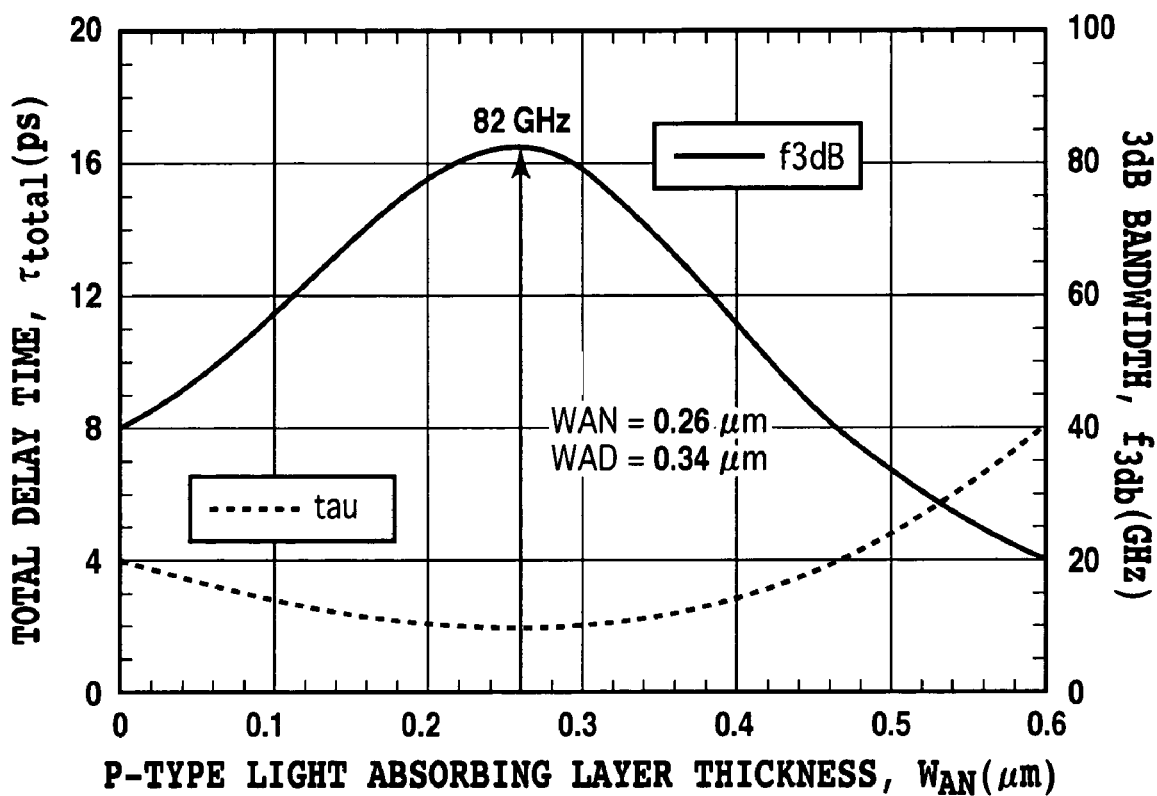
FIG. 5B is a diagram for explaining variation in the carrier transit time and the 3 dB bandwidth during the pin-PD operation of the APD of the present invention and for explaining a sample calculation of $t_{total}$ and $f_{3dB}$ when a structure is adopted where $f_{3dB}$=80 GHz when optimized.

FIG. 5B is a diagram for explaining sample calculations of $t_{total}$ and $f_{3dB}$ in a case of a structure in which a constant thickness of the light absorbing layer 0.6 μm, and $f_{3dB}=80$ GHz are set when optimized. From this diagram, $W_{AN}=0.26$ μm and $W_{AD}=0.34$ μm are obtained as thicknesses of the p-type and the depleted light absorbing layers giving maximum $f_{3dB}$. After all, the design method in the present invention indicates that the thickness of the depleted light absorbing layer of the avalanche photodiode which is practically meaningful is within a range of $W_{AD}>0.3$ μm, and an optimal thickness of the depleted light absorbing layer tends to increase in APDs with a lower operating speed than that handled in FIG. 3B.

Note that although explanations are made based on the charge control model in the above described second and third embodiments in order to avoid complications in the explanation, it is needless to say that methods other than the charge control model can be applied for executing the present invention. For example, by using a method based on continuous formulae using velocity-electric field characteristics of carriers in devices or by a method of Monte Carlo calculation, structure optimization with higher precision is possible without adding any changes to a guideline related to a configuration method of the APD, which forms a base of the present invention.

Moreover, although an electron transport in the p-type light absorbing layer is treated based on a diffusion mechanism, a structure provided with a quasi electric field by bandgap grading is also effective in reducing the carrier transit time. Although an optimal ratio between $W_{AN}$ and $W_{AD}$ when adopting this structure is different from that when the electron transport in the p-type light absorbing layer is only diffusion, a device design is possible based on a principle of "making the total carrier transit time a local minimum", which is a basic principle of the present invention.

INDUSTRIAL APPLICABILITY

The present invention enables to provide an ultra high speed APD capable of realizing operating voltage reduction and quantum efficiency enhancement at the same time.

The invention claimed is:

1. An avalanche photodiode comprising:
   a stacked layer body in which an n-type electrode layer, an avalanche multiplication layer, an electric field control layer, a graded bandgap layer, a light absorbing layer with a layer thickness of $W_A$, and a p-type electrode layer are stacked sequentially,
   the light absorbing layer has a junction of a p-type layer with a layer thickness of $W_{AN}$ located on the side of the p-type electrode layer and a low concentration layer with a layer thickness of $W_{AD}$ located on the side of the graded bandgap inclined layer,
   an each doping profile of the p-type and the low concentration layers is determined under device operating conditions so that a p-type neutral state is maintained for the p-type layer except a region in a vicinity of an interface of the junction with the low concentration layer while the low concentration layer is depleted, and
   a ratio between the layer thickness $W_{AN}$ of the p-type layer and the layer thickness $W_{AD}$ of the low concentration layer is determined so as to satisfy a next formula in a case where $t_{total}$ is a delay time of element response accompanying a transit of carriers generated in the light absorbing layer by light absorption, $t_{N2}$ is a delay time caused by the p-type layer, $t_{D1}$ is a delay time caused by the low concentration layer, and $t_D$ is a delay time when an entire region of the light absorbing layer is the low concentration layer, under a condition that a layer thickness $W_A$ ($=W_{AN}+W_{AD}$) of the light absorbing layer is constant $$t_D > t_{total} = (W_{AD} \times t_{D1} + W_{AN} \times t_{N2})/W_A \qquad \text{[Formula 1]}.$$

2. The avalanche photodiode according to claim 1, wherein the ratio between the layer thickness $W_{AN}$ of the p-type layer and the layer thickness $W_{AD}$ of the low concentration layer is determined so that a formula $[(W_{AD} \times t_{D1} + W_{AN} \times t_{N2})/W_A]$ takes on a local minimum.

3. The avalanche photodiode according to claim 1, wherein the p-type layer and the low concentration layer are formed of an InGaAsP mixed crystal semiconductor, and a depletion thickness of the low concentration layer during the device operation is thicker than 0.3 μm ($W_{AD} > 0.3$ μm).

* * * * *